United States Patent
Lin et al.

(10) Patent No.: US 11,450,735 B2
(45) Date of Patent: Sep. 20, 2022

(54) METHOD OF FORMING GUARD RING AND CIRCUIT DEVICE

(71) Applicant: TAIWAN SEMICONDUCTOR MANUFACTURING COMPANY, LTD., Hsinchu (TW)

(72) Inventors: Wan-Yen Lin, Hsinchu (TW); Wun-Jie Lin, Hsinchu (TW); Yu-Ti Su, Hsinchu (TW); Bo-Ting Chen, Hsinchu (TW); Jen-Chou Tseng, Hsinchu (TW); Kuo-Ji Chen, Hsinchu (TW); Sun-Jay Chang, Hsinchu (TW); Min-Chang Liang, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 156 days.

(21) Appl. No.: 16/952,305

(22) Filed: Nov. 19, 2020

(65) Prior Publication Data

US 2021/0091176 A1  Mar. 25, 2021

Related U.S. Application Data

(60) Division of application No. 16/185,526, filed on Nov. 9, 2018, now Pat. No. 10,868,112, which is a
(Continued)

(51) Int. Cl.
*H01L 29/06* (2006.01)
*H01L 27/02* (2006.01)
(Continued)

(52) U.S. Cl.
CPC .... *H01L 29/0619* (2013.01); *H01L 21/26513* (2013.01); *H01L 21/76* (2013.01);
(Continued)

(58) Field of Classification Search
CPC ......... H01L 29/0619; H01L 21/823431; H01L 21/26513; H01L 29/0646; H01L 21/761;
(Continued)

(56) References Cited

U.S. PATENT DOCUMENTS

| 6,479,869 B1 | 11/2002 | Hiraga |
| 6,927,345 B2 | 8/2005 | Wu et al. |

(Continued)

FOREIGN PATENT DOCUMENTS

| CN | 102779812 | 11/2012 |
| KR | 1020110059485 | 6/2011 |
| KR | 1020140044256 | 4/2014 |

OTHER PUBLICATIONS

Office Action dated Aug. 16, 2018 from corresponding application No. CN 201410655989.
(Continued)

*Primary Examiner* — Bac H Au
(74) *Attorney, Agent, or Firm* — Hauptman Ham, LLP

(57) ABSTRACT

A method includes implanting a first guard ring around a periphery of core circuitry. The implanting of the first guard ring includes implanting a first component a first distance from the core circuitry on a first side of the core circuitry, and implanting a second component a second distance from the core circuitry on a second side of the core circuitry, wherein the second distance is greater than the first distance. The method further includes implanting a second guard ring around the periphery of the core circuitry. The implanting of the second guard ring includes implanting a third component a third distance from the core circuitry on the first side of the core circuitry, and implanting a fourth component a fourth distance from the core circuitry on the second side of the core circuitry, wherein the third distance is greater than the fourth distance.

20 Claims, 4 Drawing Sheets

Related U.S. Application Data continuation of application No. 15/242,894, filed on Aug. 22, 2016, now Pat. No. 10,128,329, which is a division of application No. 14/464,298, filed on Aug. 20, 2014, now Pat. No. 9,450,044.

(51) Int. Cl.

| | | |
|---|---|---|
| *H01L 21/76* | (2006.01) | |
| *H01L 27/088* | (2006.01) | |
| *H01L 29/66* | (2006.01) | |
| *H01L 29/78* | (2006.01) | |
| *H01L 21/265* | (2006.01) | |
| *H01L 21/761* | (2006.01) | |
| *H01L 21/8234* | (2006.01) | |

(52) U.S. Cl.
CPC .... *H01L 21/761* (2013.01); *H01L 21/823431* (2013.01); *H01L 21/823481* (2013.01); *H01L 27/0207* (2013.01); *H01L 27/0251* (2013.01); *H01L 27/0886* (2013.01); *H01L 29/0646* (2013.01); *H01L 29/66795* (2013.01); *H01L 29/785* (2013.01)

(58) Field of Classification Search
CPC ......... H01L 21/823481; H01L 27/0207; H01L 21/76; H01L 29/785; H01L 27/0251; H01L 29/66795; H01L 27/0886
See application file for complete search history.

(56) References Cited

U.S. PATENT DOCUMENTS

| | | |
|---|---|---|
| 7,129,779 B2 | 10/2006 | Inao et al. |
| 9,123,810 B2 | 9/2015 | Hong et al. |
| 9,530,835 B1 | 12/2016 | Khor |
| 2008/0157124 A1 | 7/2008 | Taniguchi et al. |
| 2011/0062522 A1 | 3/2011 | Kato |
| 2011/0265051 A1 | 10/2011 | Yeh |
| 2013/0026550 A1 | 1/2013 | Yoshioka |
| 2013/0032882 A1 | 2/2013 | Salcedo |
| 2013/0277745 A1 | 10/2013 | Tsai |
| 2015/0021713 A1 | 1/2015 | Cheng et al. |
| 2015/0187753 A1 | 7/2015 | Campi, Jr. et al. |
| 2017/0097496 A1 | 4/2017 | Jo et al. |

OTHER PUBLICATIONS

Office Action dated Nov. 18, 2015 and English translation from case No. KR 1020140158068.

METHOD OF FORMING GUARD RING AND CIRCUIT DEVICE

PRIORITY CLAIM

The present application is divisional of U.S. application Ser. No. 16/185,526, filed Nov. 9, 2018, which is a continuation of U.S. application Ser. No. 15/242,894, filed Aug. 22, 2016, now U.S. Pat. No. 10,128,329, issued Nov. 13, 2018, which is a divisional of U.S. application Ser. No. 14/464,298, filed Aug. 20, 2014, now U.S. Pat. No. 9,450,044, issued Sep. 20, 2016, which are incorporated herein by reference in their entireties.

BACKGROUND

Guard rings are used as isolation regions between devices within integrated circuits. Guard rings surround a perimeter of circuit devices in order to reduce interference between adjacent devices. In some approaches, guard rings associated with fin field-effect transistor (FinFET) circuit devices also include fin structures.

Guard rings also help to dissipate energy in a circuit device during an electro-static discharge (ESD) event. An ESD event occurs when a large flow of electricity passes from one element to another. Guard rings are used to help channel the large flow of electricity to reduce a risk of damage to the circuit device. Guard rings impact a holding voltage within a circuit device. The holding voltage is related to an ability of the guard rings to dissipate energy during an ESD event. In some approaches, a space between adjacent guard rings is increased in order to increase a holding voltage of the circuit device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
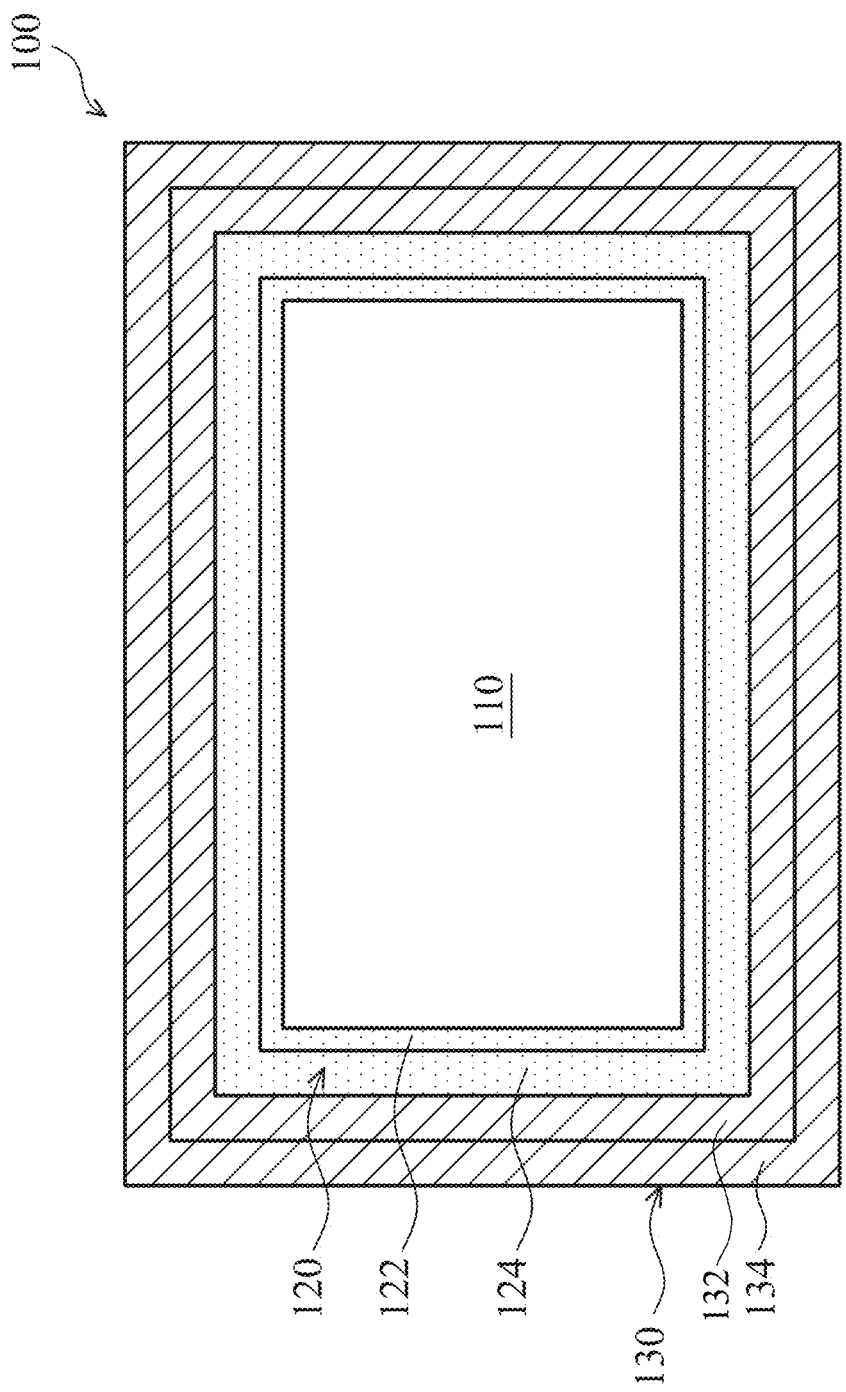
FIG. 1 is a top view of a circuit device including guard rings in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a top view of a circuit device 100 including guard rings in accordance with some embodiments. Circuit device 100 includes core circuitry 110. Circuit device 100 further includes a first set of guard rings 120 enclosing a periphery of core circuitry 110. Circuit device 100 further includes a second set of guard rings 130 enclosing a periphery of first set of guard rings 120. First set of guard rings 120 has an opposite dopant type from second set of guard rings 130. An outer surface of first set of guard rings 120 is in contact with an inner surface of second set of guard rings 130.

Core circuitry 110 includes active devices for performing a desired function or task. In some embodiments, the active devices in core circuitry 110 have a smaller gate length than active devices in input/output (I/O) portions of a circuit. In some embodiments, the active devices in core circuitry 110 have a lower operating voltage than active devices in I/O portions of the circuit. In some embodiments, the active devices include field-effect transistors (FETs), fin FETs (FinFETs), bi-polar transistors (BJTs), or other types of active devices. In some embodiments, core circuitry 110 also includes passive devices such as resistors, capacitors or other types of passive devices. In some embodiments, core circuitry 110 includes a plurality of doped areas in a substrate, e.g., source and drain regions.

First set of guard rings 120 includes a first guard ring 122 around a periphery of core circuitry 110. Each guard ring of first set of guard rings 120 includes a doped region within a substrate which includes core circuitry 110. In some embodiments, at least one guard ring of first set of guard rings 120 includes contact features, such as fin structures, to provide an energy dissipation path. In some embodiments, first guard ring 122 is in direct contact with a closest doped region of core circuitry 110. In some embodiments, first guard ring 122 includes a doping type opposite to a doping type of the closest doped region of core circuitry 110. In some embodiments, first guard ring 122 is separated from the closest doped region of core circuitry 110.

First set of guard rings 120 further includes a second guard ring 124. Second guard ring 124 has a same dopant type as first guard ring 122. Second guard ring 124 is in direct contact with first guard ring 122. In some embodiments, a shape of second guard ring 124 matches a shape of first guard ring 122. In some embodiments, a dopant concentration of second guard ring 124 is equal to a dopant concentration of first guard ring 122. In some embodiments, the dopant concentration of second guard ring 124 is different from the dopant concentration of first guard ring 122. In some embodiments, a width of second guard ring 124 is equal to a width of first guard ring 122. In some embodiments, the width of second guard ring 124 is different from the width of first guard ring 122.

FIG. 1 includes two guard rings, i.e., first guard ring 122 and second guard ring 124, in first set of guard rings 120. In some embodiments, more than two guard rings are included in first set of guard rings 120. In some embodiments, at least one of the additional guard rings has a same width as at least one of first guard ring 122 or second guard ring 124. In some embodiments, at least one of the additional guard rings has a different width from at least one of first guard ring 122 or second guard ring 124. In some embodiments, at least one of the additional guard rings has a different dopant concentration from at least one of first guard ring 122 or second guard ring 124. In some embodiments, at least one of the additional guard rings has a same dopant concentration as at least one of first guard ring 122 or second guard ring 124.

Second set of guard rings 130 includes a third guard ring 132 adjacent to first set of guard rings 120. Third guard ring 132 is in direct contact with a closest guard ring of first set of guard rings 120. Second set of guard rings 130 has an opposite dopant type from first set of guard rings 120.

Second set of guard rings 130 further includes a fourth guard ring 134. Fourth guard ring 134 has a same dopant type as third guard ring 132. Fourth guard ring 134 is in direct contact with third guard ring 132. In some embodiments, a shape of fourth guard ring 134 matches a shape of third guard ring 132. In some embodiments, a dopant concentration of fourth guard ring 134 is equal to a dopant concentration of third guard ring 132. In some embodiments, the dopant concentration of fourth guard ring 134 is different from the dopant concentration of third guard ring 132. In some embodiments, a width of fourth guard ring 134 is equal to a width of third guard ring 132. In some embodiments, the width of fourth guard ring 134 is different from the width of third guard ring 132.

FIG. 1 includes two guard rings, i.e., third guard ring 132 and fourth guard ring 134, in second set of guard rings 130. In some embodiments, more than two guard rings are included in second set of guard rings 130. In some embodiments, at least one of the additional guard rings has a same width as at least one of third guard ring 132 or fourth guard ring 134. In some embodiments, at least one of the additional guard rings has a different with from at least one of third guard ring 132 or fourth guard ring 134. In some embodiments, at least one of the additional guard rings has a different dopant concentration from at least one of third guard ring 132 or fourth guard ring 134. In some embodiments, at least one of the additional guard rings has a same dopant concentration as at least one of third guard ring 132 or fourth guard ring 134.

FIG. 1 includes second set of guard rings 130 around a periphery of first set of guard rings 120. In some embodiments, first set of guard rings 120 and second set of guard rings 130 are arranged in an alternating fashion. For example, first guard ring 122 is closest to core circuitry 110; third guard ring 132 is around a periphery of the first guard ring; second guard ring 124 is around a periphery of the third guard ring; and fourth guard ring 134 is around a periphery of the second guard ring.

In some embodiments, first set of guard rings 120 includes a p-type dopant and second set of guard rings 130 includes an n-type dopant. In some embodiments, first set of guard rings 120 includes an n-type dopant and second set of guard rings 130 includes a p-type dopant. In some embodiments, the p-type dopant is chosen from boron, $BF_2$, or other suitable p-type dopants. In some embodiments, the n-type dopant is chosen from phosphorous, arsenic, or other suitable n-type dopants.

In some embodiments, core circuitry 110 includes FinFET active devices. In some embodiments, at least one of first set of guard rings 120 or second set of guard rings 130 includes fin structures.

In comparison with other approaches which include spaces between adjacent guard rings, circuit device 100 facilitates reducing an area of the chip because first set of guard rings 120 is in contact with second set of guard rings 130. The opposite dopant types of first set of guard rings 120 from second set of guard rings 130 also helps to increase a holding voltage of circuit device 100, which helps reduce a risk of damage to the circuit device during an electro-static discharge (ESD) event. The opposite dopant types also help to provide increased isolation between adjacent circuit devices, e.g., circuit devices 100, in order to help reduce interference between neighboring circuit devices.

Figure 2A:
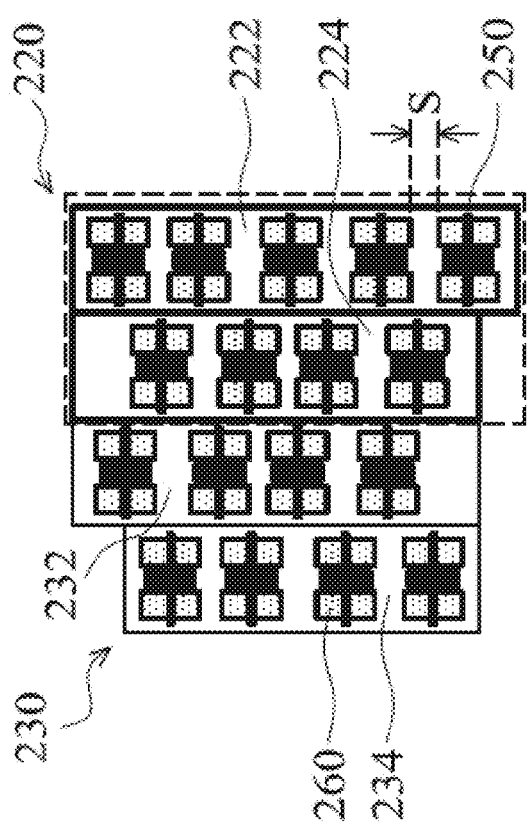
FIG. 2A is a top view of a portion of guard rings in a first direction in accordance with some embodiments.

FIG. 2A is a top view of a portion of guard rings in a first direction in accordance with some embodiments. A first set of guard rings 220 is similar to first set of guard rings 120 (FIG. 1). A second set of guard rings 230 is similar to second set of guard rings 130. First set of guard rings 220 includes a first guard ring 222 similar to first guard ring 122. First set of guard rings 220 also includes a second guard ring 224 similar to second guard ring 124. First set of guard rings 220 also includes a number of fin structures 250 in first guard ring 222 and in second guard ring 224. Second set of guard rings 230 includes a third guard ring 232 similar to third guard ring 132. Second set of guard rings 230 further includes a fourth guard ring 234 similar to fourth guard ring 134. Second set of guard rings 230 also includes a number of fin structures 260 in third guard ring 232 and fourth guard ring 234.

Fin structures 250 within first guard ring 222 are spaced from one another in a direction parallel to a top surface of a substrate of a circuit device, e.g., circuit device 100 (FIG. 1), by a distance S. The distance S between adjacent fin structures 250 is determined based on processing rules for formation of first guard ring 222. Processing rules include design rules used during a production process to provide sufficient element size and spacing to help ensure proper functioning of a circuit device. In some embodiments, each fin structure 250 includes at least one contact. In some embodiments, the contacts from each fin structure 250 in first guard ring 222 are connected together by a connection line. In some embodiments, the connection line is connected to a reference voltage, e.g., a ground voltage. In some embodiments, at least one contact from a fin structure 250 in first guard ring 222 is separated from a contact of another fin structure 250 in the first guard ring.

Fin structures 250 within second guard ring 224 are similar to fin structures 250 in first guard ring 222. Fin structures 250 in second guard ring 224 are offset with respect to fin structures 250 in first guard ring 222. The offset arrangement means that a portion of a fin structure 250 in second guard ring 224 overlaps with a fin structure 250 in first guard ring 222 in a direction perpendicular to the spacing between adjacent fins structures in the first guard ring. In some embodiments, the portion of fin structure 250 in second guard ring 224 overlapping with the fin structure in first guard ring 222 ranges from about 30% to about 70%. In some embodiments, the portion of fin structure 250 in second guard ring 224 overlapping with the fin structure in first guard ring 222 ranges from about 45% to about 55%. If the overlapping portion is too small, formation of fin structures 250 in adjacent guard rings becomes difficult. If the overlapping portion is too large, an ability of first set of guard rings 220 to dissipate energy during an electro-static discharge (ESD) event is reduced due to a lower density of contacts in the first set of guard rings.

In some embodiments, a contact of at least one fin structure 250 in second guard ring 224 is electrically connected to a contact of at least one fin structure in first guard ring 222. In some embodiments, contacts of all fin structures 250 in second guard ring 224 are separated from contacts of all fin structures in first guard ring 222.

Fin structures 260 within third guard ring 232 are spaced from one another in the direction parallel to the top surface of the substrate of the circuit device, e.g., circuit device 100 (FIG. 1). A spacing between adjacent fin structures 260 is determined based on processing rules for formation of third guard ring 232. In some embodiments, the spacing between adjacent fin structures 260 is equal to the spacing between adjacent fin structures 250. In some embodiments, the spacing between adjacent fin structures 260 is different from the spacing between adjacent fin structures 250. Each fin structure 260 includes at least one contact. In some embodiments, the contacts from each fin structure 260 in third guard ring 232 are connected together by a connection line. In some embodiments, the connection line is connected to a reference voltage, e.g., a ground voltage. In some embodiments, at least one contact from a fin structure 260 in third guard ring 232 is separated from a contact of another fin structure 260 in the third guard ring.

Fin structures 260 within fourth guard ring 234 are similar to fin structures 260 in third guard ring 232. Fin structures 260 in fourth guard ring 234 are offset with respect to fin structures 260 in third guard ring 232. In some embodiments, a portion of fin structure 260 in fourth guard ring 234 overlapping with the fin structure in third guard ring 232 ranges from about 30% to about 70%. In some embodiments, the portion of fin structure 260 in fourth guard ring 234 overlapping with the fin structure in third guard ring 232 ranges from about 50%. In some embodiments, the portion of fin structure 260 in fourth guard ring 234 overlapping with the fin structure in third guard ring 232 is equal to the portion of fin structure 250 in second guard ring 224 overlapping with the fin structure in first guard ring 222. In some embodiments, the portion of fin structure 260 in fourth guard ring 234 overlapping with the fin structure in third guard ring 232 is different from the portion of fin structure 250 in second guard ring 224 overlapping with the fin structure in first guard ring 222. If the overlapping portion is too small, formation of fin structures 260 in adjacent guard rings becomes difficult. If the overlapping portion is too large, an ability of second set of guard rings 230 to dissipate energy during an ESD event is reduced due to a lower density of contacts in the second set of guard rings.

In some embodiments, at least one fin structure 260 in third guard ring 232 is aligned with at least one fin structure 250 in second guard ring 224. Aligned means that a first surface perpendicular to direction of the at least one fin structure 260 is in line with a first surface of the at least one fin structure 250, and that a second surface of the at least one fin structure 260 opposite to the first surface is in line with a second surface of the at least one fin structure 250 opposite to the first surface. In some embodiments, all fin structures 260 in third guard ring 232 are offset with respect to all fin structures 250 in second guard ring 224.

In some embodiments, a contact of at least one fin structure 260 in fourth guard ring 234 is electrically connected to a contact of at least one fin structure in third guard ring 232. In some embodiments, contacts of all fin structures 260 in fourth guard ring 234 are separated from contacts of all fin structures in third guard ring 232.

Figure 2B:
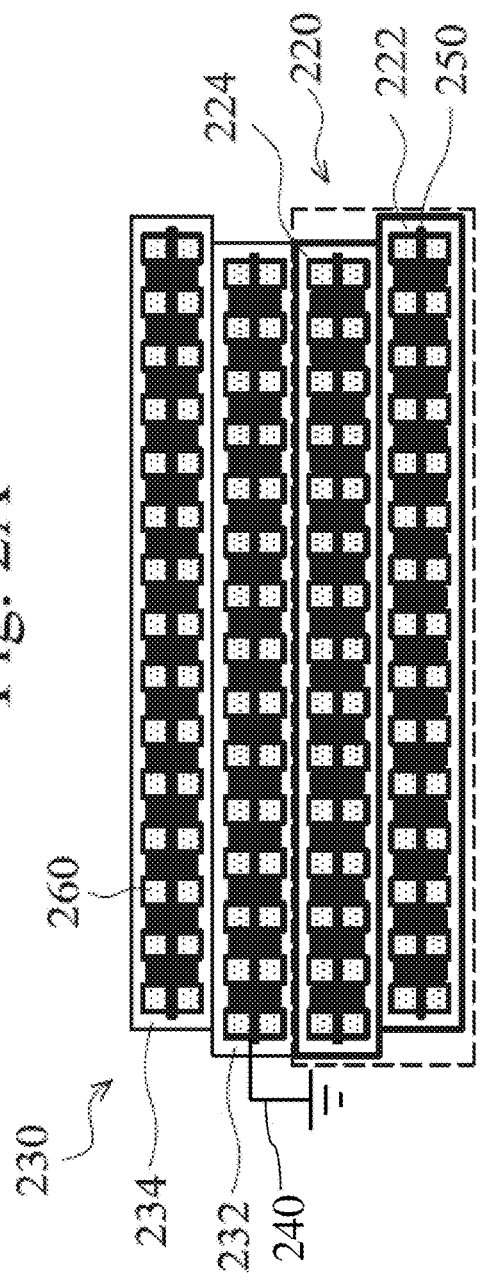
FIG. 2B is a top view of a portion of guard rings in a second direction in accordance with some embodiments.

FIG. 2B is a top view of a portion of guard rings in a second direction in accordance with some embodiments. FIG. 2B includes similar elements as FIG. 2A and similar elements have a same reference number. The second direction of FIG. 2B is perpendicular to the first direction from FIG. 2A. In comparison with fin structures 250 in the first direction (FIG. 2A), a distance between adjacent fin structures 250 of first set of guard rings 220 is smaller in the second direction (FIG. 2B). In some embodiments, adjacent fin structures 250 in first set of guard rings 220 are in contact in the second direction. Similarly, fin structures 260 in the second direction have a smaller separating distance in comparison with fin structures 260 in the first direction. In some embodiments, adjacent fin structures 260 in the second direction are in contact with each other.

Adjacent fin structures 250 and adjacent fin structures 260 are able to be formed closer together due to reduced processing variation in the second direction in comparison with the first direction. In some embodiments, at least one fin structure 250 in first guard ring 222 extending in the second direction is aligned with at least one fin structure 250 in second guard ring 224 extending in the second direction. In some embodiments, all fin structures 250 in first guard ring 222 extending in the second direction are offset from all fin structures 250 in second guard ring 224 extending in the second direction. In some embodiments, at least one fin structure 260 in third guard ring 232 extending in the second direction is aligned with at least one fin structure 260 in fourth guard ring 234 extending in the second direction. In some embodiments, all fin structures 260 in third guard ring 232 extending in the second direction are offset from all fin structures 260 in fourth guard ring 234 extending in the second direction. In some embodiments, at least one fin structure 260 in third guard ring 232 extending in the second direction is aligned with at least one fin structure 250 in second guard ring 224 extending in the second direction. In some embodiments, all fin structures 260 in third guard ring 232 extending in the second direction are offset from all fin structures 250 in second guard ring 224 extending in the second direction.

In some embodiments, an arrangement of fin structures 250 and fin structures 260 from FIG. 2A are combined with an arrangement of fin structures 250 and fin structures 260 from FIG. 2B to form guard rings which enclose an entire periphery of core circuitry, e.g., core circuitry 110 (FIG. 1). For example, in some embodiments, the first direction is a vertical direction of FIG. 1 and the second direction is a horizontal direction of FIG. 1.

FIGS. 3A-3F are top views of a variety of guard ring layouts in accordance with some embodiments. FIGS. 3A-3F include a variety of different layout options for shape and orientation of different components of guard rings. FIGS. 3A-3F include similar elements as circuit device 100 (FIG. 1) and similar elements have a same reference number increased by 200. In contrast with rectangular doped regions as in FIGS. 1-2B, the shapes and orientations of guard rings from FIG. 3A-3F are examples of alternative geometries for doped regions. FIGS. 3A-3F are merely examples and are not intended to limit the different variations of the current description.

Figure 3A:
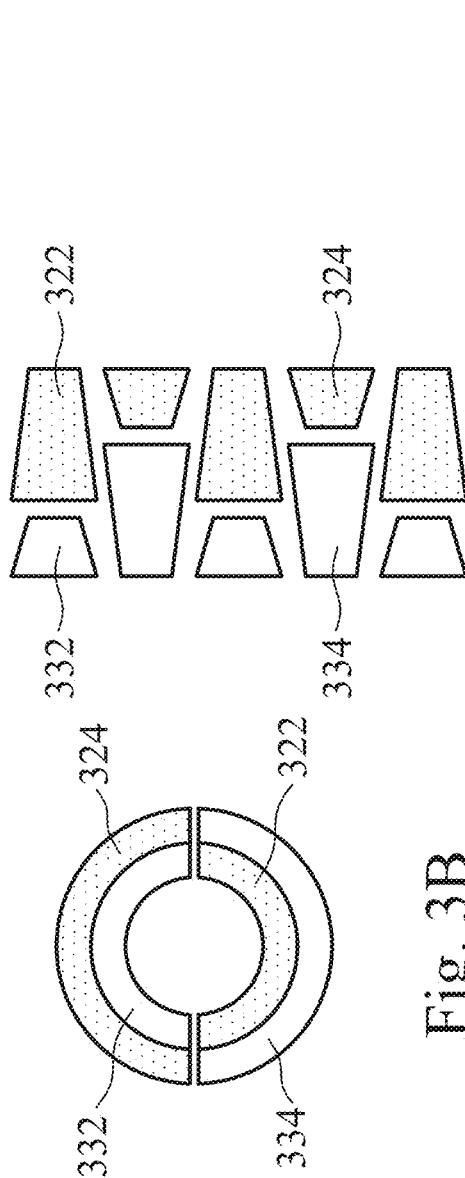
FIGS. 3A-3F are top views of a variety of guard ring layouts in accordance with some embodiments.

FIG. 3A includes a series of square-shaped areas of component parts of guard rings 322-334 arranged in a checkered pattern. FIG. 3A includes second guard ring 324 between first guard ring 322 and third guard ring 332. In some embodiments, core circuitry, e.g., core circuitry 110 (FIG. 1), is located closest to first guard ring 322. In some embodiments, core circuitry is located closest to fourth guard ring 334.

Figure 3B:
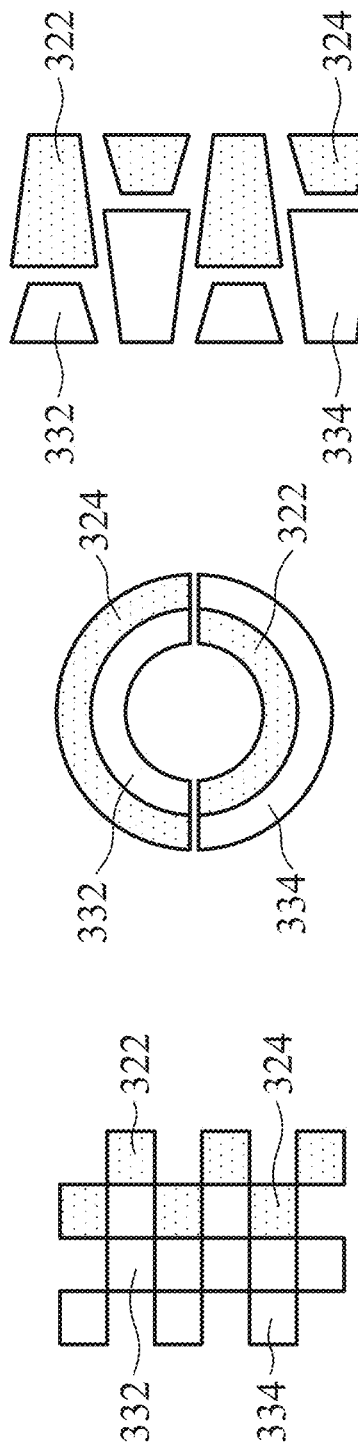

FIG. 3B includes a circular arrangement of component parts of guard rings 322-334. FIG. 3B includes first guard ring 322 adjacent to a first portion of core circuitry (not shown) and third guard ring 332 adjacent to a second portion of the core circuitry. Second guard ring 324 is around a periphery of third guard ring 332 around the second portion of the core circuitry. Fourth guard ring 334 is around a periphery of first guard ring 322 around the first portion of the core circuitry.

Figure 3C:
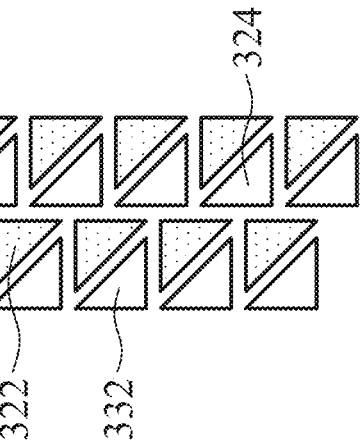

FIG. 3C is a trapezoidal arrangement of component parts of guard rings 322-334. FIG. 3C includes alternating first guard ring 322 and second guard ring 324, where a size of the first guard ring is greater than a size of the second guard ring. Similarly, third guard ring 332 is arranged in an alternating fashion with fourth guard ring 334, with the fourth guard ring having a size greater than the third guard ring. Third guard ring 332 is matched with first guard ring 322 and fourth guard ring 334 is matched with second guard ring 324 to maintain a consistent thickness of the combination of guard rings 322-334. In some embodiments, core circuitry, e.g., core circuitry 110 (FIG. 1), is located closest to first guard ring 322 and second guard ring 324. In some embodiments, core circuitry is located closest to third guard ring 332 and fourth guard ring 334.

Figure 3D:
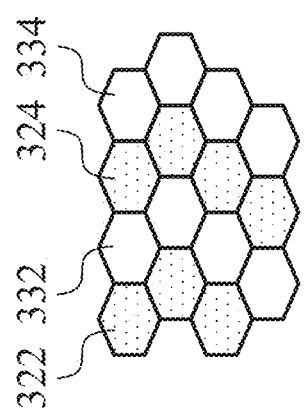

FIG. 3D is a free-form polygonal arrangement of components parts of guard rings 322-334. The free-form polygonal shape in FIG. 3D includes protrusions from one guard ring extending into an adjacent guard ring of a similar dopant type. For example, protrusions from first guard ring 322 extend between features of second guard ring 324. However, the free-form polygonal shape is not limited to this arrangement. In some embodiments, core circuitry, e.g., core circuitry 110 (FIG. 1), is located closest to first guard ring 322 and second guard ring 324. In some embodiments, core circuitry is located closest to third guard ring 332 and fourth guard ring 334.

Figure 3E:
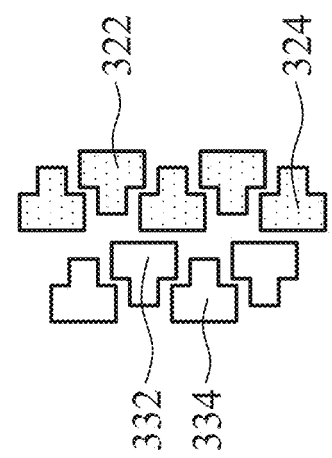

FIG. 3E is a hexagonal arrangement of component parts of guard rings 322-334. The hexagonal arrangement includes third guard ring 332 between first guard ring 322 and second guard ring 324. The hexagonal arrangement also includes second guard ring 324 between third guard ring 332 and fourth guard ring 334. In some embodiments, guard rings having a same dopant type are positioned adjacent to each other. In some embodiments, core circuitry, e.g., core circuitry 110 (FIG. 1), is located closest to first guard ring 322. In some embodiments, core circuitry is located closest to fourth guard ring 334.

Figure 3F:
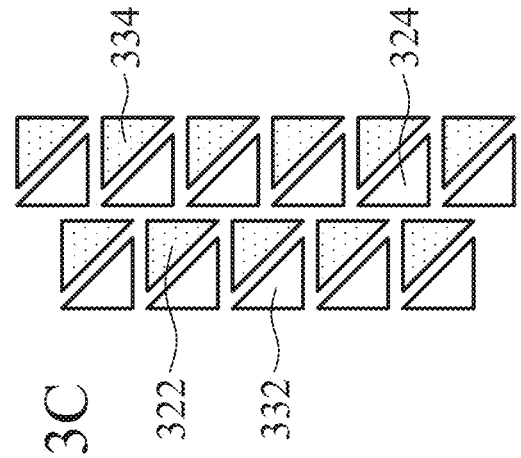

FIG. 3F is a triangular arrangement of guard rings 322-334. The triangular arrangement includes portions of first guard ring 322 alternating with portions third guard ring 332 and portions of second guard ring 324 alternating with portions of fourth guard ring 334. Third guard ring 332 is adjacent to fourth guard ring 334. In some embodiments, first guard ring 322 is adjacent to second guard ring 324. In some embodiments, core circuitry, e.g., core circuitry 110 (FIG. 1), is located closest to third guard ring 332. In some embodiments, core circuitry is located closest to fourth guard ring 334.

The different arrangements of guard rings 322-334 are provide as examples of how the current description is able to be applied to a variety of arrangement and is not intended to limit this description to only the arrangements expressed included.

Figure 4:
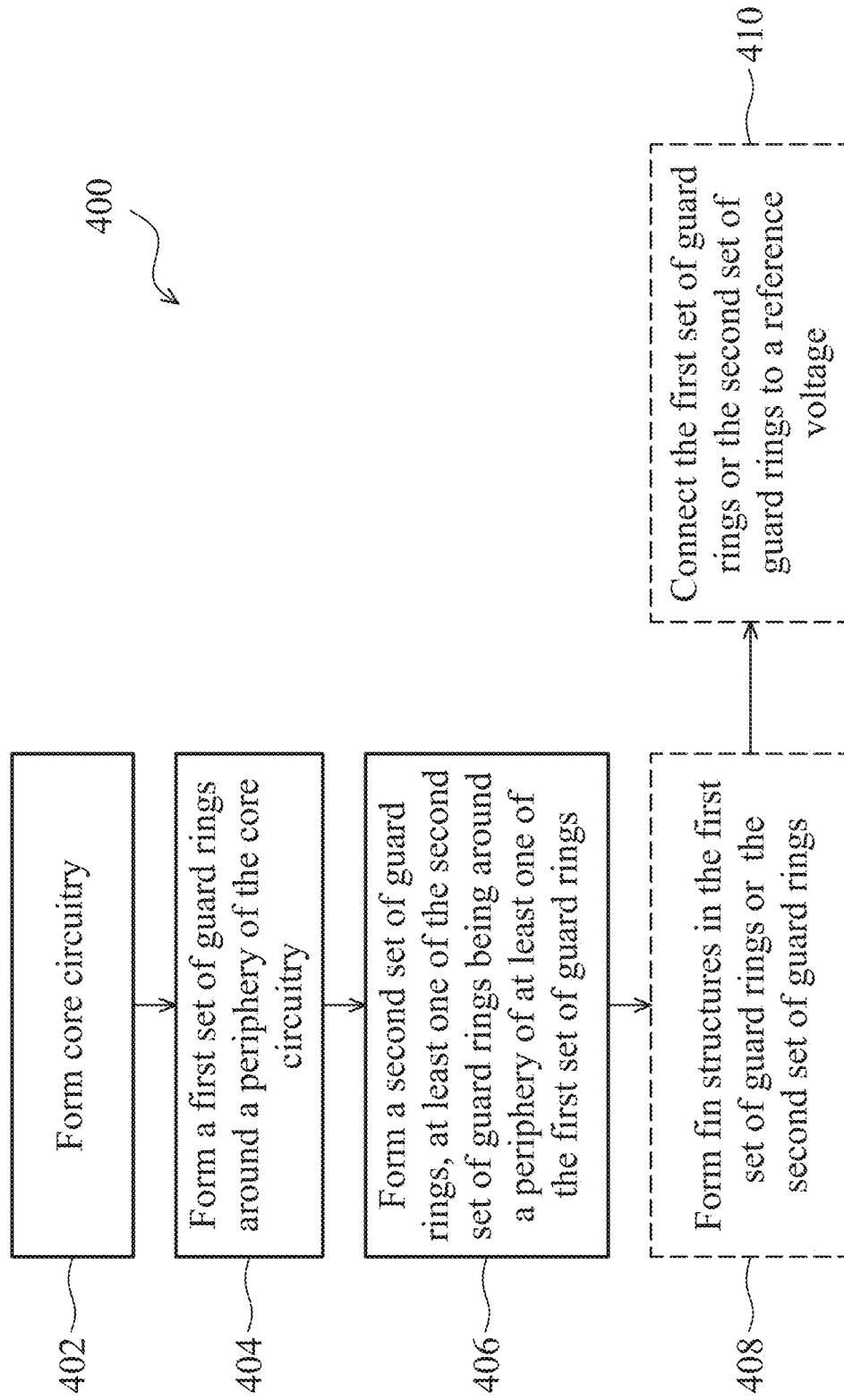
FIG. 4 is a flowchart of a method of making guard rings in accordance with some embodiments.

FIG. 4 is a flowchart of a method 400 of making guard rings in accordance with some embodiments. Method 400 begins with operation 402 in which core circuitry, e.g., core circuitry 110 (FIG. 1), is formed. In some embodiments, the core circuitry is formed using a CMOS process. In some embodiments, the core circuitry includes FinFET active elements. In some embodiments, the core circuitry includes memory elements, processing elements, registers or other suitable circuitry.

In operation 404, a first set of guard rings is formed around a periphery of the core circuitry. Each guard ring of the first set of guard rings includes a same dopant type. In some embodiments, the first set of guard rings are formed by an implantation processes. In some embodiments, the first set of guard rings includes two guard rings, e.g., first guard ring 122 and second guard ring 124 (FIG. 1). In some embodiments, the first set of guard rings includes more than two guard rings. In some embodiments, all guard rings of the first set of guard rings are formed simultaneously. In some embodiments, at least one guard ring of the first set of guard rings is formed sequentially with at least one other guard ring of the first set of guard rings. In some embodiments, all guard rings of the first set of guard rings are formed to have a same dopant concentration. In some embodiments, at least one guard ring of the first set of guard rings has a different dopant concentration from at least one other guard ring of the first set of guard rings. In some embodiments, all guard rings of the first set of guard rings has a same dopant species. In some embodiments, at least one guard ring of the first set of guard rings has a different dopant species from a dopant species of at least one other guard ring of the first set of guard rings.

In operation 406, a second set of guard rings is formed. At least one guard ring of the second set of guard rings is around a periphery of at least one guard ring of the first set of guard rings. Each guard ring of the second set of guard rings includes a same dopant type, which is opposite to the dopant type of the first set of guard rings. In some embodiments, the second set of guard rings are formed by an implantation processes. In some embodiments, the second set of guard rings includes two guard rings, e.g., third guard ring 132 and fourth guard ring 134 (FIG. 1). In some embodiments, the second set of guard rings includes more than two guard rings. In some embodiments, all guard rings of the second set of guard rings are formed simultaneously. In some embodiments, at least one guard ring of the second set of guard rings is formed sequentially with at least one other guard ring of the second set of guard rings. In some embodiments, all guard rings of the second set of guard rings are formed to have a same dopant concentration. In some embodiments, at least one guard ring of the second set of guard rings has a different dopant concentration from at least one other guard ring of the second set of guard rings. In some embodiments, all guard rings of the second set of guard rings has a same dopant species. In some embodiments, at least one guard ring of the second set of guard rings has a different dopant species from a dopant species of at least one other guard ring of the second set of guard rings.

In optional operation 408, fin structures are formed in the first set of guard rings or the second set of guard rings. In some embodiments, the fin structures are formed by etching a surface of a substrate. In some embodiments, the fin structures are formed by epitaxially growing a material over a top surface of the substrate. In some embodiments, the fin structures are spaced from each other along a first direction parallel to the top surface of the substrate. In some embodiments, fin structures in adjacent guard rings are offset with respect to one another. In some embodiments, a space between adjacent fin structures in a second direction, perpendicular to the first direction, is less than a space between adjacent fin structures in the first direction. In some embodiments, operation 408 is omitted and fin structures are not formed in the first set of guard rings or the second set of guard rings. In some embodiments, operation 408 is omitted when the doped portions of the first set of guard rings or doped portions of the second set of guard rings are directly connected to a reference voltage.

In optional operation 410, the first set of guard rings or the second set of guard rings are connected to a reference voltage. In some embodiments, the reference voltage is a ground voltage. In some embodiments which include fin structures, multiple fin structures are connected together to the reference voltage. In some embodiments, the first set of guard rings or the second set of guard rings is connected to the reference voltage using at least one connection line. In some embodiments, operation 410 is omitted when the guard ring is configured to dissipate energy through the substrate.

An order of operations of method 400 is changeable. For example, in some embodiments, the second set of guard rings is formed prior to the first set of guard rings, in some embodiments. In some embodiments, the core circuitry is formed simultaneously or subsequently with at least one of the first set of guard rings or the second set of guard rings. Additional operations are also added to method 400, in some embodiments.

An aspect of this description relates to a method. The method includes implanting a first guard ring around a periphery of core circuitry. The implanting of the first guard ring includes implanting a first component a first distance from the core circuitry on a first side of the core circuitry, and implanting a second component a second distance from the core circuitry on a second side of the core circuitry, wherein the second distance is greater than the first distance. The method further includes implanting a second guard ring around the periphery of the core circuitry. The implanting of the second guard ring includes implanting a third component a third distance from the core circuitry on the first side of the core circuitry, and implanting a fourth component a fourth distance from the core circuitry on the second side of the core circuitry, wherein the third distance is greater than the fourth distance. In some embodiments, the implanting the first component includes implanting the first component between the third component and the core circuitry. In some embodiments, the implanting the fourth component includes implanting the fourth component between the second component and the core circuitry. In some embodiments, the implanting the fourth component includes implanting the fourth component in contact with the second component, and implanting the fourth component spaced from the first component. In some embodiments, the implanting the first component includes implanting the first component sequentially with implanting the second component.

An aspect of this description relates to a method of making a circuit device. The method includes forming a guard ring surrounding core circuitry. Forming the guard ring includes forming a first plurality of fin structures arranged in a first direction parallel to a first side of the core circuitry, wherein adjacent fin structures of the first plurality of fin structures are separated by a first distance. Forming the guard ring further includes forming a second plurality of fin structures arranged in a second direction parallel to a second side of the core circuitry, wherein adjacent fin structures of the second plurality of fin structures are separated by a second distance, and the second distance is smaller than the first distance. In some embodiments, forming the first plurality of fin structures includes forming each of the first plurality of fin structures extending in a third direction. In some embodiments, forming the second plurality of fin structures includes forming each of the second plurality of fin structures extending in the third direction. In some embodiments, forming the first plurality of fin structures includes forming each of the first plurality of fin structures extending in the third direction parallel to the first direction. In some embodiments, the method further includes connecting at least one of the second plurality of fin structures to a ground voltage. In some embodiments, the method further includes forming a third plurality of fin structures arranged in the first direction, wherein adjacent fin structures of the third plurality of fin structures are separated by the first distance, and the first plurality of fin structures is between the core circuitry and the third plurality of fin structures. In some embodiments, the method further includes forming a third plurality of fin structures arranged in the second direction, wherein adjacent fin structures of the third plurality of fin structures are separated by the second distance, and the second plurality of fin structures is between the core circuitry and the third plurality of fin structures. In some embodiments, the method further includes forming a third plurality of fin structures arranged surrounding the first plurality of fin structures and the second plurality of fin structures.

An aspect of this description relates to a method of making a circuit device. The method includes implanting a first guard ring adjacent a first side of core circuitry, wherein the first guard ring comprises a first component part, and the first guard ring has a first dopant-type. The method further includes implanting a second guard ring, wherein the first guard ring is between the second guard ring and the core circuitry, the second guard ring has a second dopant-type opposite the first dopant-type, the second guard ring comprises a second component part, and a second portion of the second component part is closer to the core circuitry than a first portion of the first component part. In some embodiments, the method further includes implanting a third guard ring, wherein the second guard ring is between the first guard ring and the third guard ring. In some embodiments, implanting the third guard ring includes implanting dopants having the first dopant-type. In some embodiments, the method further includes implanting a fourth guard ring, wherein the third guard ring is between the second guard ring and the fourth guard ring. In some embodiments, implanting the fourth guard ring includes implanting dopants having the second dopant-type. In some embodiments, implanting the first guard ring includes implanting p-type dopants. In some embodiments, implanting the first guard ring includes implanting n-type dopants.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   implanting a first guard ring around a periphery of core circuitry, wherein the implanting of the first guard ring comprises:
   implanting a first component a first distance from the core circuitry on a first side of the core circuitry, and
   implanting a second component a second distance from the core circuitry on a second side of the core circuitry, wherein the second distance is greater than the first distance; and
   implanting a second guard ring around the periphery of the core circuitry, wherein the implanting of the second guard ring comprises:
   implanting a third component a third distance from the core circuitry on the first side of the core circuitry, and
   implanting a fourth component a fourth distance from the core circuitry on the second side of the core circuitry, wherein the third distance is greater than the fourth distance.

2. The method of claim 1, wherein the implanting the first component comprises implanting the first component between the third component and the core circuitry.

3. The method of claim 2, wherein the implanting the fourth component comprises implanting the fourth component between the second component and the core circuitry.

4. The method of claim 2, wherein the implanting the fourth component comprises implanting the fourth component in contact with the second component, and implanting the fourth component spaced from the first component.

5. The method of claim 2, wherein the implanting the first component comprises implanting the first component sequentially with implanting the second component.

6. A method of making a circuit device comprising:
   forming a guard ring surrounding core circuitry, wherein forming the guard ring comprises:
   forming a first plurality of fin structures arranged in a first direction parallel to a first side of the core circuitry, wherein adjacent fin structures of the first plurality of fin structures are separated by a first distance, and
   forming a second plurality of fin structures arranged in a second direction parallel to a second side of the core circuitry, wherein adjacent fin structures of the second plurality of fin structures are separated by a second distance, and the second distance is smaller than the first distance.

7. The method of claim 6, wherein forming the first plurality of fin structures comprises forming each of the first plurality of fin structures extending in a third direction.

8. The method of claim 7, wherein forming the second plurality of fin structures comprises forming each of the second plurality of fin structures extending in the third direction.

9. The method of claim 7, wherein forming the first plurality of fin structures comprises forming each of the first plurality of fin structures extending in the third direction parallel to the first direction.

10. The method of claim 6, further comprising connecting at least one of the second plurality of fin structures to a ground voltage.

11. The method of claim 6, further comprising forming a third plurality of fin structures arranged in the first direction, wherein adjacent fin structures of the third plurality of fin structures are separated by the first distance, and the first plurality of fin structures is between the core circuitry and the third plurality of fin structures.

12. The method of claim 6, further comprising forming a third plurality of fin structures arranged in the second direction, wherein adjacent fin structures of the third plurality of fin structures are separated by the second distance, and the second plurality of fin structures is between the core circuitry and the third plurality of fin structures.

13. The method of claim 6, further comprising forming a third plurality of fin structures arranged surrounding the first plurality of fin structures and the second plurality of fin structures.

14. A method of making a circuit device comprising:
    implanting a first guard ring adjacent a first side of core circuitry, wherein the first guard ring comprises a first component part, and the first guard ring has a first dopant-type; and
    implanting a second guard ring, wherein the first guard ring is between the second guard ring and the core circuitry, the second guard ring has a second dopant-type opposite the first dopant-type, the second guard ring comprises a second component part, and a second portion of the second component part is closer to the core circuitry than a first portion of the first component part.

15. The method of claim 14, further comprising implanting a third guard ring, wherein the second guard ring is between the first guard ring and the third guard ring.

16. The method of claim 15, wherein implanting the third guard ring comprises implanting dopants having the first dopant-type.

17. The method of claim 15, further comprising implanting a fourth guard ring, wherein the third guard ring is between the second guard ring and the fourth guard ring.

18. The method of claim 17, wherein implanting the fourth guard ring comprises implanting dopants having the second dopant-type.

19. The method of claim 14, wherein implanting the first guard ring comprises implanting p-type dopants.

20. The method of claim 14, wherein implanting the first guard ring comprises implanting n-type dopants.

* * * * *